(12) United States Patent
Pendse et al.

(10) Patent No.: US 7,736,950 B2
(45) Date of Patent: Jun. 15, 2010

(54) FLIP CHIP INTERCONNECTION

(75) Inventors: Rajendra D. Pendse, Fremont, CA (US); Marcos Karnezos, Palo Alto, CA (US); Kyung-Moon Kim, Ichon-si (KR); Koo Hong Lee, Seoul (KR); Moon Hee Lee, Ichon-si (KR); Orion Starr, San Jose, CA (US)

(73) Assignee: STATS ChipPAC, Ltd., Singapore (SG)

( * ) Notice: Subject to any disclaimer, the term of this patent is extended or adjusted under 35 U.S.C. 154(b) by 1064 days.

(21) Appl. No.: 11/435,305

(22) Filed: May 15, 2006

(65) Prior Publication Data

US 2009/0045507 A1 Feb. 19, 2009

Related U.S. Application Data

(63) Continuation-in-part of application No. 10/985,654, filed on Nov. 10, 2004, now Pat. No. 7,368,817.

(60) Provisional application No. 60/594,920, filed on May 18, 2005, provisional application No. 60/594,872, filed on May 14, 2005, provisional application No. 60/594,873, filed on May 14, 2005.

(51) Int. Cl.
*H01L 21/44* (2006.01)
*H01L 29/40* (2006.01)

(52) U.S. Cl. ............... 438/108; 438/126; 438/127; 257/778; 257/E21.503; 257/E21.506

(58) Field of Classification Search ......... 438/106–108, 438/125–127; 257/734, 778, 737, 761
See application file for complete search history.

(56) References Cited

U.S. PATENT DOCUMENTS 6,495,397 B2 * 12/2002 Kubota et al. ............ 438/108
6,798,072 B2 * 9/2004 Kajiwara et al. .......... 257/778

* cited by examiner

*Primary Examiner*—Hsien-ming Lee
(74) *Attorney, Agent, or Firm*—Robert D. Atkins (57) ABSTRACT

Methods for forming flip chip interconnection, in which the bump interconnect is defined at least in part by an underfill. The underfill includes a material that is thermally cured; that is, raising the temperature of the underfill material can result in progressive curing of the underfill through stages including a gel stage and a fully cured stage. According to the invention, during at least an early stage in the process the semiconductor chip is carried by a thermode, which is employed to control the temperature of the assembly in a specified way. Also, flip chip interconnections and flip chip packages made according to the methods of invention.

33 Claims, 4 Drawing Sheets

FLIP CHIP INTERCONNECTION

CROSS-REFERENCE TO RELATED APPLICATIONS

This Application claims the benefit of U.S. Provisional Application No. 60/594,920, filed May 18, 2005, titled "Semiconductor interconnection system", by Rajendra D. Pendse et al; and this Application claims the benefit of U.S. Provisional Application No. 60/594,872, filed May 14, 2005, titled "Semiconductor interconnection system", by Rajendra D. Pendse; and this Application claims the benefit of U.S. Provisional Application No. 60/594,873, filed 14 May 2005, titled "Semiconductor interconnection system", by Rajendra D. Pendse; each of these application is hereby incorporated herein by reference. This application is a Continuation-In-Part and claims priority from U.S. application Ser. No. 10/985,654, filed Nov. 10, 2004, now U.S. Pat. No. 7,368,817 titled "Bump-on-lead flip chip interconnection", by Rajendra D. Pendse, which is hereby incorporated herein by reference.

BACKGROUND

This invention relates to semiconductor packaging and, particularly, to flip chip interconnection.

Flip chip packages include a semiconductor die mounted onto a package substrate with the active side of the die facing the substrate. Conventionally, interconnection of circuitry in the die with the substrate is made by way of bumps which are attached to an array of interconnect pads on the die and bonded to a corresponding (complementary) array of interconnect pads (often referred to as "capture pads") on a patterned metal layer at the die attach surface of the substrate. Typically an underfill between the active side of the die and the die mount surface of the substrate protects the interconnections and mechanically stabilizes the assembly. Underfill materials are known; typically they include a resin, which may be a curable resin, plus a filler, which is typically a fine particulate material (such as, for example, silica or alumina particles). The particular resin and the filler (type of filler material, the particle size(s), e.g.), and the proportion of filler in the resin, are selected to provide suitable properties (mechanical and adhesion) to the underfill material, both during processing and in the resulting underfill. Conventionally the underfill is formed after the interconnection has been made between the interconnect sites on the substrate and the bumps on the die, by applying the underfill material in a liquid form to the narrow space between the die and the substrate near an edge of the die, whereupon the underfill material is permitted to flow by capillary action into the space ("capillary underfill"). Alternatively the underfill can be formed by applying a quantity of underfill material to the active side of the die or to the die mount side of the substrate, then moving the die toward the substrate and pressing the bumps against the interconnect sites ("no-flow underfill").

Conventionally a flip chip interconnection using a no-flow underfill is made by: dispensing the underfill material onto the substrate, positioning the die onto the substrate (with the bumps on the interconnect sites) using a pick-and-place tool, and heating the assembly to reflow the bumps. Challenges using this conventional method include trapping of filler (which is a component of the underfill material) between the bumps and the metal at the interconnect sites, resulting in an electrically compromised connection; die "float" during reflow, also resulting in poor connection; and formation of voids in the resulting underfill.

Flip chip technology is gaining increasing interest in semiconductor packaging by virtue of compelling advantages in miniaturization and electrical performance over conventional wire bonding technology. However, many entry barriers exist in the areas of infrastructure, manufacturing cost and design.

One major impediment to acceptance of flip chip technology has been an inability to reduce the interconnection pitch. This limitation results primarily from the propensity of adjacent solder bumps to short during the reflow bonding operation.

The areal density of electronic features on integrated circuits has increased enormously, and chips having a greater density of circuit features also may have a greater density of sites for interconnection with a package substrate. Accordingly another impediment to acceptance of flip chip technology has to do with limitations in substrate technology. In conventional flip chip package substrates the capture pads corresponding to the respective solder bumps on the die are relatively large. Additionally, conventional flip chip package substrates include a "solder mask" consisting of a layer of an insulating material over the patterned circuitry on the substrate, having openings formed to expose the capture pads (known as a "solder mask"); the solder mask confines the solder when the bump melts. Techniques for defining the openings have relatively poor resolution, and the design dimensions of the capture pads and additional tolerance dimensions are conventionally provided for the distances between capture pads and adjacent circuitry, to accommodate errors in the positions and sizes of solder mask openings. These two limitations adversely affect the routing efficiency of the substrate to which the die is attached.

The flip chip package, including a die mounted on a substrate, is connected to underlying circuitry, such as a printed circuit board (e.g., a "motherboard") in the device in which it is employed, by way of second level interconnects (e.g., pins) between the package and the underlying circuit. Another limitation in flip chip substrate technology relates to the fact that the second level interconnects have a significantly greater pitch than the flip chip interconnects, and so the routing on the substrate conventionally "fans out" from the interconnect pads to the second level interconnects. Significant technological advances have enabled construction of fine lines and spaces; but in the conventional arrangement space between adjacent pads limits the number of traces that can escape from the more inward capture pads in the array, and the fan out routing between the capture pads beneath the die and the external pins of the package is conventionally formed on multiple metal layers within the package substrate. For a complex interconnect array, substrates having multiple layers may be required to achieve routing between the die pads and the second level interconnects on the package. Multiple layer substrates are expensive, and in conventional flip chip constructs the substrate alone typically accounts for more than half the package cost (about 60% in some typical instances). The high cost of multilayer substrates has been a factor in limiting proliferation of flip chip technology in mainstream products.

Moreover, in conventional flip chip constructs the escape routing pattern typically introduces additional electrical parasitics, because the routing includes short runs of unshielded circuitry and vias between patterned metal circuit layers in the signal transmission path. Electrical parasitics can significantly limit package performance, particularly at higher frequencies (such as radio frequencies).

A further limitation of conventional flip chip technology is that it requires expensive process apparatus with associated high financial investment levels and manufacturing costs.

SUMMARY

In general the invention features methods for forming flip chip interconnection, in which the bump interconnect is defined at least in part by an underfill. The underfill includes a material that is thermally cured; that is, raising the temperature of the underfill material can result in progressive curing of the underfill through stages including a gel stage and a fully cured stage. According to the invention, during at least an early stage in the process the semiconductor chip is carried by a thermode, which is employed to control the temperature of the assembly in a specified way. Particularly, in various general aspects of the invention, the thermode may be used to assist in deforming the bump under pressure against an interconnect site on the substrate circuitry; to melt a fusible part of the bump; to partially cure the underfill to a gel stage; to fully cure the underfill; or to carry out some combination of these stages. The thermode directly heats the die, and through the die indirectly heats the bumps attached to the die pads, as well as underfill material in contact with the die surface of the die or with the bumps, as well as underlying circuitry in contact with the bumps and the underfill material. Heating stages not performed by the thermode can be carried out in a reflow oven. According to the invention, no solder mask is required, as the flow of solder during a reflow step is limited by an underfill, which is formed in situ.

In one aspect the bumps and the active side of the die are brought into contact with the underfill material, the bumps are brought into contact under force with the interconnect sites on the circuitry to deform the bumps against the interconnect sites; the thermode is employed to heat the die, resulting in raising the temperature of the underfill material to a gel stage; then the thermode is employed to further heat the die, raising the temperature of the bumps to a temperature at which the fusible portion of the bump (the entire bump in some embodiments) melts; the gel stage of the underfill may be resilient enough to allow some compression, but it is sufficiently firm to contain the melted bump material. As the heating continues to melt the bump material, the underfill material further cures and eventually becomes fully cured. Then the thermode is controlled to allow the assembly to cool, and the pressure is released, permitting the bumps to fuse and form the interconnects.

In another aspect the bumps and the active side of the die are brought into contact with the underfill material, the bumps are brought into contact under force with the interconnect sites on the circuitry to deform the bumps against the interconnect sites; the thermode is employed to heat the die, resulting in raising the temperature of the underfill material to a gel stage that is sufficiently firm to secure the contact between the bumps and the interconnect sites. Then the pressure is released, and the die is disengaged from the thermode and placed in a reflow oven, where the temperature of the assembly is raised to further cure the underfill to form a firm gel, and then the temperature of the assembly is raised to a temperature at which the fusible portion of the bump (the entire bump in some embodiments) melts. As the heating continues to melt the bump material, the underfill material further cures and eventually becomes fully cured. Then the oven is controlled (or the assembly is removed from the oven) to allow the assembly to cool, permitting the bumps to fuse and form the interconnects.

In general, in these aspects, the invention features methods for forming a flip chip package, employing a thermode tool to apply heat and pressure to promote distribution of the underfill material between the die and the substrate. The underfill material is applied to the die or to the substrate prior to placement of the die. The die is aligned with the substrate using a pick-and-place tool having a heater (thermode), such that interconnect bumps or balls on the die contact the corresponding interconnect sites on the substrate. Using the thermode tool, pressure and heat are applied sufficient to displace the underfill material from between the bumps or balls and the interconnect sites and to deform the bumps and form a clean contact between the bumps or balls and the interconnect sites, and the underfill is permitted to gel at least partly. Then the temperature is raised to melt the bumps or balls. The melt may be carried out using the thermode tool, and in some such processes pressure may be maintained throughout the completion of the gel and the melt. Or, the thermode tool may be separated from the die following the partial gel of the underfill and the deformation of the bumps or balls, and thereafter the completion of the gel and the melt may be carried out in a reflow oven.

In another aspect the bumps and the active side of the die are brought into contact with the underfill material, the bumps are brought into contact under force with the interconnect sites on the circuitry to deform the bumps against the interconnect sites; the thermode is employed to heat the die for a short time to heat the bumps to a temperature below the melting point of the fusible material in the bumps; the heat and the pressure are sufficient to displace the filler and resin of the underfill material from between the bumps and the interconnect site, and to form a temporary solid state bond between the bumps and the site, sufficient to secure the chip through the reflow process. Then the pressure is released, and the die is disengaged from the thermode and placed in a reflow oven, where the temperature of the assembly is raised to cure the underfill material to a firm gel, and then is raised further to a temperature at which the fusible portion of the bump (the entire bump in some embodiments) melts. As the heating continues to melt the bump material, the underfill material further cures and eventually becomes fully cured. Then the oven is controlled (or the assembly is removed from the oven) to allow the assembly to cool, permitting the bumps to fuse and form the interconnects.

In another aspect the bumps and the active side of the die are brought into contact with the underfill material, the bumps are brought into contact under force with the interconnect sites on the circuitry to deform the bumps against the interconnect sites; the thermode is employed to heat the die to a temperature and for a short time sufficient to melt the fusible material in the bumps (and to partially cure the underfill material); the fusible portion of the bump reflows onto the interconnect site under the force, effecting a secure solder joint. Where the bump is collapsible, the temperature is raised by the thermode to above the melt temperature for only a short period, so as to avoid collapse of the bumps. Then the pressure is released, and the die is disengaged from the thermode and placed in a reflow oven, where the temperature of the assembly is raised to cure the underfill to a firm gel and then to fully cure the underfill material; optionally the temperature of the assembly may be raised further in the oven, to above the melting temperature of the fusible portion of the bumps, to result in a second reflow. Then the oven is controlled (or the assembly is removed from the oven) to allow the assembly to cool, permitting the bumps to fuse and form the interconnects.

In these approaches the application of heat and pressure at the early stage suppresses and can prevent void formation. The method can provide for greater tolerance for variations in planarity in the substrate and in the bumps, by "ironing out" noncoplanarities by application of force and pressure; and they can provide higher connection yields, by employing a compressive force during the first reflow to ensure reliable mating of the bumps with the pads.

These approaches can be particularly suitable for flip chip interconnection of bumps or balls on narrow circuit elements on the substrate, as for example in "bond-on-narrow pad interconnections", as described generally in copending U.S. application Ser. No. 11/388,755, filed Mar. 26, 2006; and as for example in "bump-on-lead interconnections", as described generally in copending U.S. application Ser. No. 110/985,654, filed Nov. 10, 2004, both incorporated herein by reference. Reduced pressure may be required when employing these methods on narrow circuit features, because the bump may be more readily deformed over a narrow lead or pad than onto a wider capture pad.

These approaches permit reflow of passive elements onto the substrate during the flip chip interconnect reflow step; that is, only a single reflow may be necessary.

In general, in these aspects, the invention features methods for forming an underfill in a flip chip package, employing a thermode tool to apply heat and pressure to promote distribution of the underfill material between the die and the substrate. The underfill material is applied to the die or to the substrate prior to placement of the die. The die is aligned with the substrate using a pick-and-place tool having a heater (thermode), such that interconnect bumps or balls on the die contact the corresponding interconnect sites on the substrate. Using the thermode tool, pressure and heat are applied sufficient to displace the underfill material from between the bumps or balls and the interconnect sites and to form a solid state interconnection. Then the thermode tool is separated from the die and the assembly is heated in a reflow oven to gel the underfill. In packages where the interconnect is completed by melting the bumps or balls, the melt may be effected by using the thermode to raise the temperature of the bumps or balls above the melting point; or, the melt may be effected in the reflow oven, after the tool has been separated from the die. Where the melt is effected by using the thermode to raise the temperature of the bumps or balls above the melting point, a subsequent remelt may be carried out in the reflow oven.

The behavior of the bump material during the various stages of the method depend upon their metallurgical properties: whether the material collapses, for example. The various methods may be more readily useful if, for example, the bump is of a eutectic material; or if it is a fully collapsible bump; or if it is a noncollapsible bump (of a high-lead (Pd) material, or a high melting point material, with a eutectic solder fusible material at the region of contact with the interconnect site on the substrate; or if it is a noncollapsible bump used with a fusible solder applied to the interconnect site on the substrate (e.g., as a paste).

The flip chip package structure and assembly processes according to the invention address limitations of conventional flip chip packaging. Particularly, interconnection can be achieved at finer pitch with a more efficient substrate design; and the manufacturing apparatus is comparatively simple and the processes are relatively straightforward.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

All patents and patent applications referred to above or below are incorporated herein by reference.

Figure 1A:
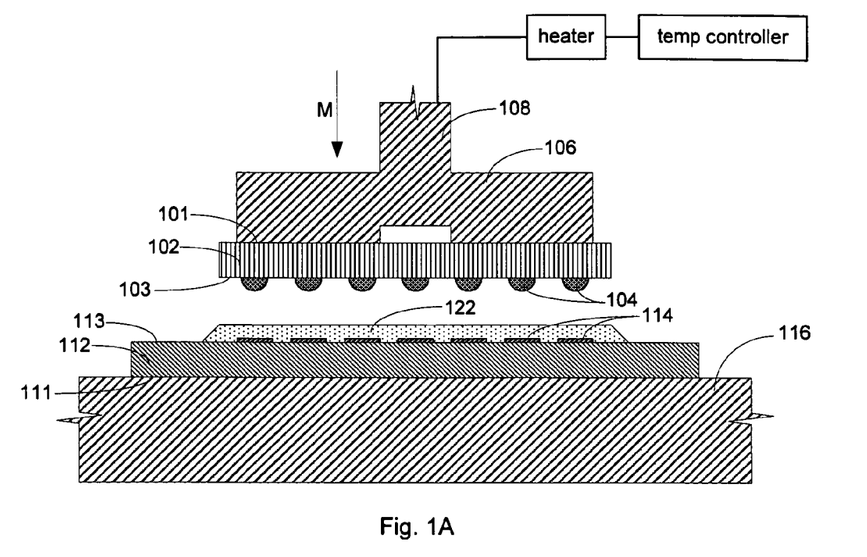
FIGS. 1A, 1B, 1C are diagrammatic sketches in sectional view illustrating steps in a generalized process for formation of a flip chip interconnection according to the invention.
Figure 1B:
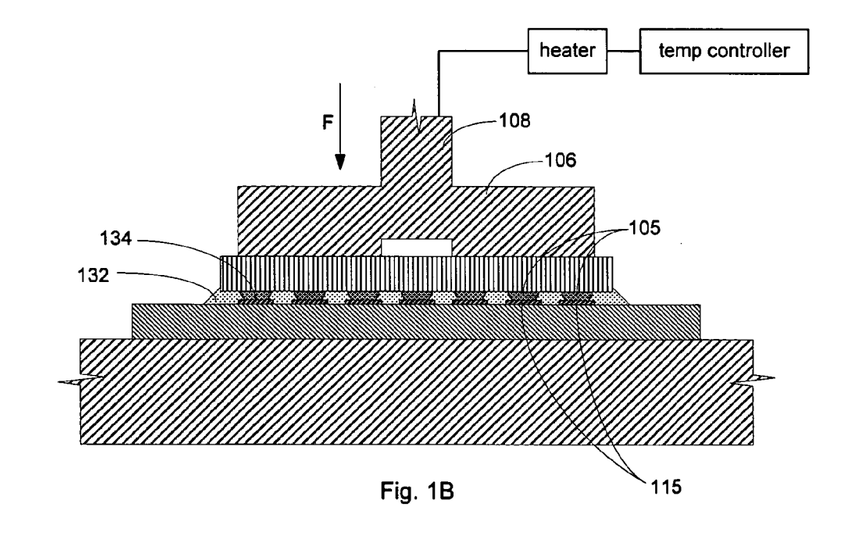
Figure 1C:
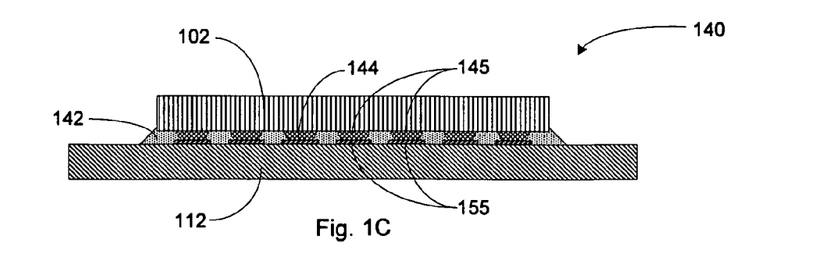

A generalized method for making an interconnection according to the invention is shown diagrammatically in FIGS. 1A-1C.

Referring to the FIGs., a substrate 112 is provided, having at least one dielectric layer and having a metal layer on a die attach surface 113, the metal layer being patterned to provide circuitry, particularly traces or leads 114 having sites for interconnection, on the die attach surface. The substrate 112 is supported, for example on a carrier or stage 116, with a substrate surface opposite the die attach surface 113 facing the support. A quantity of an encapsulating resin 122 is dispensed over the die attach surface 113 of the substrate, covering at least the interconnect sites on the leads 114. A die 102 is provided, having bumps 104 attached to die pads (not shown in the FIG.) on the active side 103. The bumps include a fusible material which contacts the mating surfaces of the leads. A pick-and-place tool 108 having a heater (that is, a thermode) under control of a temperature controller (which may be manipulated by a person serving as an operator, or which may be a programmable controller such as a computer) including a chuck 106 picks up the die by contact of the chuck 106 with the backside 101 of the die. Using the pick-and-place thermode tool, the die is positioned facing the substrate with the active side of the die toward the die attach surface of the substrate, as shown in FIG. 1A; and the die and substrate are aligned and moved one toward the other (arrow M) so that the bumps 104 contact the corresponding interconnect sites on the traces (leads) 114 on the substrate. Then a force is applied (arrow F) to press the bumps 105 onto the mating surfaces 134 at the interconnect sites on the leads 115, as shown in FIG. 1B. Preferably the force is sufficient at least to displace the adhesive 122 from between the bumps and the mating surfaces at the interconnect sites on the leads 154. The bumps may be deformed by the force, breaking the oxide film on the contacting surface of the bumps and/or on the mating surface of leads. The deformation of the bumps may result in the fusible material of the bumps being pressed onto the top and over the edges of the lead.

According to the particular embodiment of the invention that is being employed, the adhesive may be caused to cure at least partially, as shown at 132, as for example by heating to a selected temperature (the controller operating through the heater). At this stage the adhesive need only be partially cured, that is, only to an extent sufficient subsequently to prevent flow of molten solder along an interface between the adhesive and the conductive traces. Then, according to the embodiment of the invention that is being employed, the fusible material of the bumps 105 is melted and then is resolidified, forming a metallurgical interconnection between the bump 105 and lead 115, and the adhesive curing is completed, to complete the die mount and to secure the electrical interconnection at the mating surface (now an interconnect interface) 144, as shown generally at 140 in FIG. 1C. The adhesive is a thermally curable adhesive, and the extent of curing at any phase in the process is controlled by regulating the temperature.

Figure 2A:
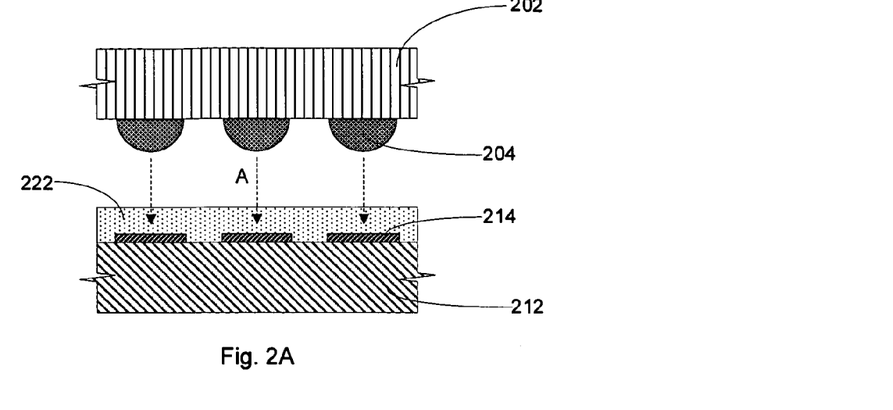
FIGS. 2A, 2B, 2C, 2D are diagrammatic sketches in sectional view showing general steps in formation of a flip chip interconnection according to the invention.
Figure 2B:
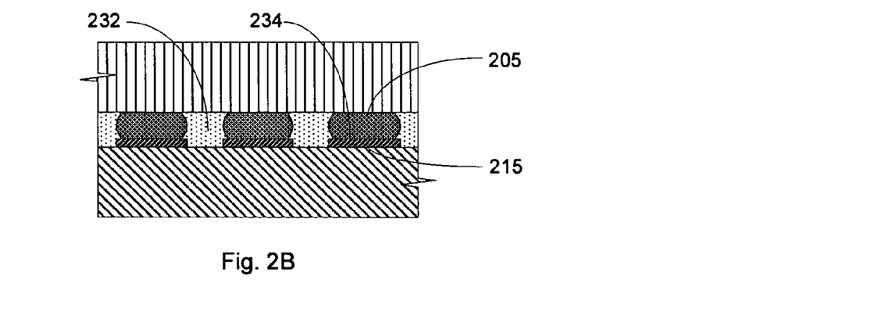
Figure 2C:
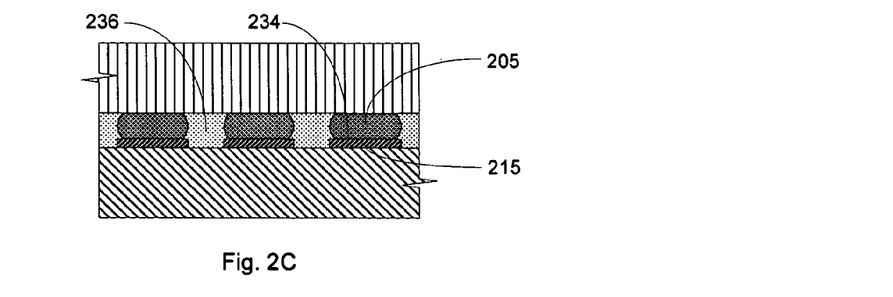
Figure 2D:
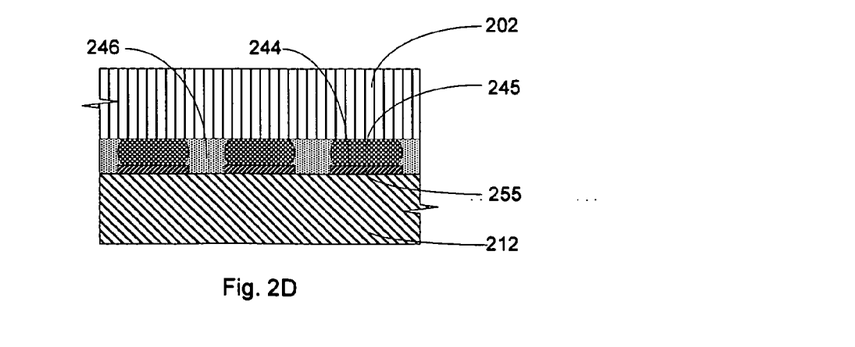

The process is shown in further detail in FIGS. 2A-2D. In FIG. 2A, a substrate 212 is provided on a die attach surface with conductive (metal) traces 214, and interconnect sites on the traces are covered with an adhesive 222. The die 202 is positioned in relation to the substrate 212 such that the active side of the die faces the die attach side of the substrate, and is aligned (arrows A) such that bumps 204 on the die are aligned with corresponding mating surfaces on traces 214. The die and the substrate are moved toward one another so that the bumps contact the respective mating surfaces on the traces. Then as shown in FIG. 2B a force is applied to move the bumps 205 and traces 215 against one another, displacing the adhesive as shown at 232 in FIG. 2B, and deforming the bumps onto the mating surfaces 234 and over the edges of the traces. Deformation of the bumps on the traces breaks the oxide film on the contact surfaces of the bumps and the mating surfaces of the traces, establishing a good electrical connection, and deformation of the bumps over the edges of the traces helps establish a good temporary mechanical connection. According to the particular embodiment of the invention that is being employed, heat is applied to partially cure the adhesive as shown at 236 in FIG. 2C. Then heat is applied to raise the temperature of the bumps sufficiently to cause the fusible material of the bumps to melt, as shown in FIG. 2D. This substantially (though not necessarily fully) completes the cure of the adhesive 246 and completes the metallurgical interconnection of the bumps 245 onto the mating surfaces 244 at the interconnect sites on the leads 215. The cured adhesive stabilizes the die mount.

In an alternative embodiment of a preferred method, the adhesive can be pre-applied to the die surface, or at least to the bumps on the die surface, rather than to the substrate. A preferred technique for applying a no-flow underfill, useful in this invention, is described, for example, in U.S. Pat. No. 6,780,682, titled "Process for precise encapsulation of flip chip interconnects", which issued Aug. 24, 2004 from U.S. application Ser. No. 10/081,425, filed Feb. 22, 2002, hereby incorporated by reference.

Generally according to this technique a limited quantity of encapsulating resin is applied to the interconnect side of the chip, and thereafter the chip and substrate are apposed with the corresponding bumps and pads aligned, and then the chip and substrate are brought together under conditions as described above that promote the bonding of the bumps on the metal pads. The resin may be applied to the interconnect side of the chip in any of a variety of ways. For example, a defined quantity of resin can conveniently and reliably be applied selectively to the chip by dipping the interconnect side of the chip in a pool of the resin to a predetermined depth, and then withdrawing the chip from the resin pool. A quantity of resin, precisely defined by the predetermined depth to which the chip was dipped in the resin pool, remains on the dipped portion of the chip as the chip is withdrawn from the resin pool and brought to the substrate for assembly. Most conveniently and reliably, the pool of resin is provided to a shallow depth in a reservoir, and the chip is dipped into the pool of resin in the reservoir so that the bumps contact the bottom of the reservoir. The predetermined shallow depth of the resin pool thereby determines the quantity of resin that remains on the dipped portion of the chip as the chip is withdrawn from the pool.

An advantage of this technique is that the resin pattern is self-aligned to the chip, so that there is no requirement for alignment of the dispense pattern with the flip chip footprint pattern on the substrate. Moreover the resin is applied preferentially to the portions of the interconnect side of the chip on which application of resin is most particularly desired, that is, on hand in the vicinity of the bumps. The resin reservoir is readily integrated with existing chip attachment equipment, so that there is no need for specialized were dedicated equipment or process steps for applying resin using this technique. Then forcing, curing, and melting are carried out as described above.

Figure 3:
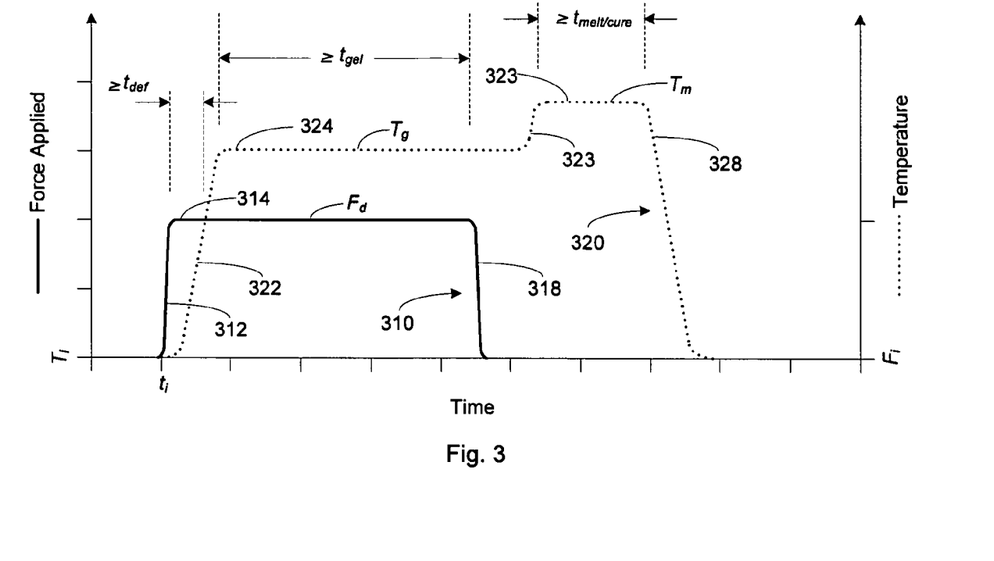
FIG. 3 is a diagrammatic sketch showing a force and temperature schedule for a process for making a flip chip interconnection according to an aspect of the invention.

A force and temperature schedule for a process according to one aspect of the invention is shown diagrammatically by way of example in FIG. 3 In this chart, time runs from left to right on the horizontal axis; a force profile 310 is shown as a thick solid line, and a temperature profile 320 is shown as a dotted line. The temperature profile in this example begins at a temperature in the range about 80° C.-about 90° C. The force profile begins at essentially zero force. The force is applied by the pick-and-place tool, which according to the invention is provided with a controlled heater (and therefore may be referred to as a "thermode"). Beginning at an initial time $t_i$ the force is rapidly (nearly instantaneously) raised 312 from $F_i$ to a displacement/deformation force $F_d$ and held 314 at that force for a time, as discussed below. $F_d$ is a force sufficiently great to displace the adhesive away from between the bumps and the mating surfaces of the leads; and, preferably, sufficient to deform the fusible (lead-contacting) portion of the bumps onto the mating surface, breaking the oxide films and forming a good metal-to-metal (metallurgical) contact, and, in some embodiments, over the edges of the leads to establish a mechanical interlock of the bumps and the leads ("creep" deformation). The total amount of force required will depend upon the bump material and dimensions and upon the number of bumps, and can be determined without undue experimentation. As the force is raised, the temperature is also rapidly raised 322 from an initial temperature $T_i$ to a gel temperature Tg. The heat is according to the invention applied through the die by the thermode. The gel temperature Tg is a temperature sufficient to partially cure the adhesive (to a "gel") and, in this example, is below the melting point of the fusible portion of the bumps (e.g., 170° C. for the case where the bumps are a eutectic solder having a melting point at 183° C. Preferably, the force and temperature ramps are set so that there is a short lag time $t_{def}$ following the moment when $F_d$ is reached and before $T_g$ is reached, at least long enough to permit the elevated force to displace the adhesive and to deform the bumps before the partial cure of the adhesive commences. The assembly is held 314, 324 at the displacement/deformation pressure $F_d$ and at the gel temperature $T_g$ for a time $t_{gel}$ sufficient to effect the partial cure of the adhesive. The adhesive should become sufficiently firm that it can subsequently maintain a good bump profile during the solder remelt phase—that is, sufficiently firm to prevent undesirable displacement of the molten fusible material of the bump, or flow of the molten fusible material along the leads. Once the adhesive has partially cured to a sufficient extent, the pressure may be ramped down rapidly 318 to substantially no force (weight of the components). The temperature is then rapidly raised further 323 to a temperature $T_m$ sufficient to remelt the fusible portions (solder) of the bumps, and the assembly is held 325 at the remelt temperature $T_m$ for a time $t_{melt/cure}$ at least sufficient to fully form the solder remelt on the traces, and preferably sufficient to substantially (though not necessarily fully) cure the adhesive. Then the temperature is ramped down 328 to the initial temperature $T_i$, and eventually to ambient. The process outlined in FIG. 3 can run its course over a time period of 5-10 seconds.

As noted above, the adhesive in embodiments as in FIG. 3 is a "no-flow underfill". In some approaches to flip chip interconnection, the metallurgical interconnection is formed first, and then an underfill material is flowed into the space between the die and the substrate. The "no-flow underfill" according to the invention is applied before the die and the substrate are brought together, and the no-flow underfill is displaced by the approach of the bumps onto the leads, and by the opposed surfaces of the die and the substrate. The adhesive for the no-flow underfill adhesive according to the invention is preferably a fast-gelling adhesive—that is, a material that gels sufficiently at the gel temperature in a time period in the order of 1-2 seconds. Preferred materials for the no-flow underfill adhesive include, for example, so-called non-conductive pastes, such as those marketed by Toshiba Chemicals and by Loktite-Henkel, for example.

Figure 4:
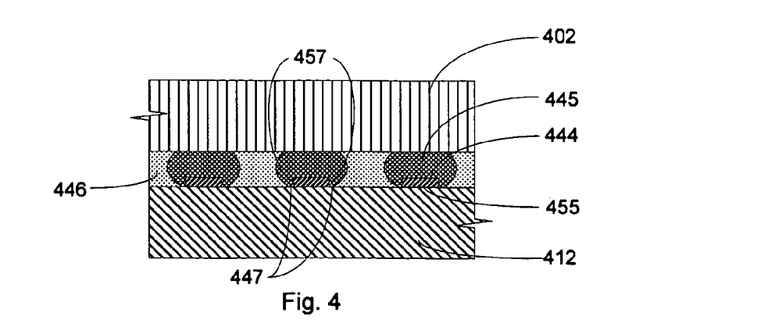
FIG. 4 is a diagrammatic sketch in a sectional view showing a portion of a flip chip interconnection structure according to an aspect of the invention.

An interconnect formed according to an aspect of the invention is shown is sectional view in FIG. 4. The die 402 is connected by way of remelted bumps 445 onto interconnect sites 444 on the circuitry 455 of the substrate 412. In this example the circuit elements at the interconnect sites are narrower than the diameter of the bumps (where attached to the pads on the die), and the bumps have deformed 447 over the edges 457 of the circuit elements at the interconnect sites. No solder mask is necessary, as the spread of molten solder during the remelt stage is limited by the partially cured no-flow underfill 446.

Figure 5A:
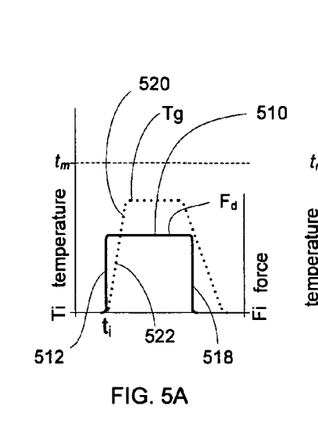
FIGS. 5A, 5B are diagrammatic sketches showing a force and temperature schedule for a process for making a flip chip interconnection according to another aspect of the invention.
Figure 5B:
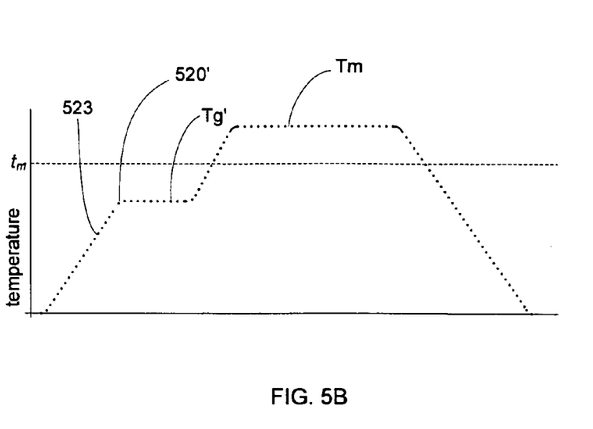

A force and temperature schedule for a process according to another aspect of the invention is shown diagrammatically by way of example in FIGS. 5A, 5B. FIG. 5A shows a portion of the process in which the pressure and temperature are governed by the thermode. FIG. 5B shows a subsequent portion of the process which is conducted in a reflow oven. In these charts, time runs from left to right on the horizontal axis; a force profile 510 is shown as a thick solid line, and temperature profile 520, 520' are shown as a dotted line. The temperature profile in this example begins at a temperature in the range about 80° C.-about 90° C. The force profile begins at essentially zero force. The force is applied by the pick-and-place tool, which according to the invention is provided with a controlled heater (and therefore may be referred to as a "thermode"). Beginning at an initial time $t_i$ the force is rapidly (nearly instantaneously) raised 512 from $F_i$ to a displacement/deformation force $F_d$ and held at that force for a time, as discussed below. $F_d$ is a force sufficiently great to displace the adhesive away from between the bumps and the mating surfaces of the leads; and, preferably, sufficient to deform the fusible (lead-contacting) portion of the bumps onto the mating surface, breaking the oxide films and forming a good metal-to-metal (metallurgical) contact, and, in some embodiments, over the edges of the leads to establish a mechanical interlock of the bumps and the leads ("creep" deformation). The total amount of force required will depend upon the bump material and dimensions and upon the number of bumps, and can be determined without undue experimentation. As the force is raised, the temperature is also rapidly raised 522 from an initial temperature $T_i$ to a gel temperature Tg. The heat is according to the invention applied through the die by the thermode. The gel temperature Tg is a temperature sufficient to partially cure the adhesive (to a "gel"). Preferably, the force and temperature ramps are set so that there is a short lag time, following the moment when $F_d$ is reached and before $T_g$ is reached, at least long enough to permit the elevated force to displace the adhesive and to deform the bumps before the partial cure of the adhesive commences. The assembly is held at the displacement/deformation pressure $F_d$ and at the gel temperature $T_g$ for a time $t_{gel}$ sufficient to effect the partial cure of the adhesive. The adhesive should become sufficiently firm that it can subsequently maintain a good bump profile during the solder remelt phase—that is, sufficiently firm to prevent undesirable displacement of the molten fusible material of the bump, or flow of the molten fusible material along the leads. Once the adhesive has partially cured to a sufficient extent, the pressure may be ramped down rapidly 518 to substantially no force (weight of the components). The assembly is then released from the thermode and placed in a reflow oven for further processing, as shown in FIG. 5B. In the reflow oven the temperature is rapidly raised further 523 to a temperature $T_g{'}$ sufficient to form a firm gel in the underfill material, and then to a temperature $T_m$ sufficient to remelt the fusible portions (solder) of the bumps, and the assembly is held at the remelt temperature $T_m$ for a time at least sufficient to fully form the solder remelt on the traces, and preferably sufficient to substantially (though not necessarily fully) cure the adhesive. Then the temperature is ramped down to the initial temperature $T_i$, and eventually to ambient. The process outlined in FIGS. 5A, 5B can run its course over a time period of 5-10 seconds.

Figure 6A:
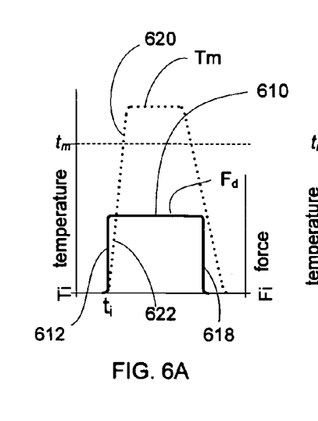
FIGS. 6A, 6B are diagrammatic sketches showing a force and temperature schedule for a process for making a flip chip interconnection according to another aspect of the invention.
Figure 6B:
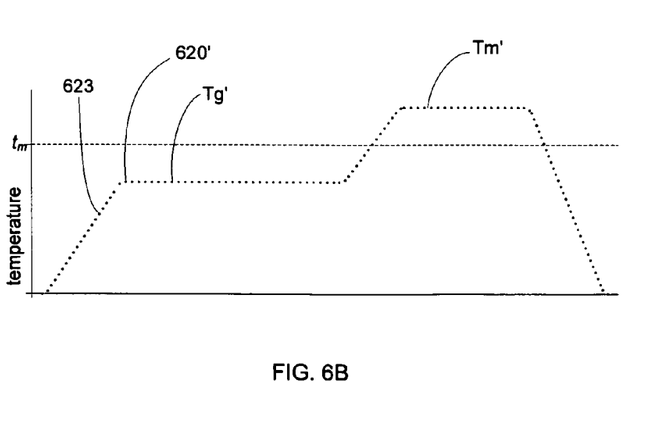

A force and temperature schedule for a process according to another aspect of the invention is shown diagrammatically by way of example in FIGS. 6A, 6B. FIG. 6A shows a portion of the process in which the pressure and temperature are governed by the thermode. FIG. 6B shows a subsequent portion of the process which is conducted in a reflow oven. In these charts, time runs from left to right on the horizontal axis; a force profile 610 is shown as a thick solid line, and temperature profile 620, 620' are shown as a dotted line. The temperature profile in this example begins at a temperature in the range about 80° C.-about 90° C. The force profile begins at essentially zero force. The force is applied by the pick-and-place tool, which according to the invention is provided with a controlled heater (and therefore may be referred to as a "thermode"). Beginning at an initial time $t_i$ the force is rapidly (nearly instantaneously) raised 612 from $F_i$ to a displacement/deformation force $F_d$ and held at that force for a time, as discussed below. $F_d$ is a force sufficiently great to displace the adhesive away from between the bumps and the mating surfaces of the leads; and, preferably, sufficient to deform the fusible (lead-contacting) portion of the bumps onto the mating surface, breaking the oxide films and forming a good metal-to-metal (metallurgical) contact, and, in some embodiments, over the edges of the leads to establish a mechanical interlock of the bumps and the leads ("creep" deformation). The total amount of force required will depend upon the bump material and dimensions and upon the number of bumps, and can be determined without undue experimentation. As the force is raised, the temperature is also rapidly raised 622 from an initial temperature $T_i$ to a first melt temperature $T_m$. The heat is according to the invention applied through the die by the thermode. The assembly is held at the displacement/deformation pressure $F_d$ and at the melt temperature $T_m$ for a time sufficient to effect a first remelt of the fusible portion of the bump. The time is preferably short enough that the underfill material does not substantially cure. Then the pressure is ramped down rapidly 618 to substantially no force (weight of the components), and the temperature is allowed to fall well below the melt or gel point (to Ti in this example). The assembly is then released from the thermode and placed in a reflow oven for further processing, as shown in FIG. 6B. In the reflow oven the temperature is rapidly raised further 623 to a temperature $T_g'$ sufficient to form a firm gel in the underfill material, and eventually for a time long enough to fully cure the underfill material. Optionally, the temperature can be raised in the reflow oven to a second remelt temperature $T_m'$ sufficient to remelt the fusible portions (solder) of the bumps, and the assembly is held at the remelt temperature $T_m'$ for a time at least sufficient to fully form the solder remelt on the traces, and to substantially (though not necessarily fully) cure the adhesive. Then the temperature is ramped down to the initial temperature $T_i$, and eventually to ambient. The process outlined in FIGS. 6A, 6B can run its course over a time period of 5-10 seconds.

Considerably finer pitch interconnects can be obtained according to the invention. As an example, the interconnection pitch commonly used in conventional flip chip technology is 200 um, whereas, employing underfill defined bump configuration according to the invention, pitch of the order of 60 um is achievable. Fine pitch configurations obtainable according to the invention cannot be obtained by conventional flip chip technology, because in conventional methods the melting and flowing of the bump material is essentially unconstrained (because in conventional methods there is no pre-solidified (gelled) underfill material), causing solder run out and bridging of the bump material. Insulating layers of "solder mask" applied to the substrate to confine the flow of molten material are incapable of supporting fine geometries below the 150 um range.

Another significant advantage realized by the invention is a dramatic reduction in the number of processing steps and the simplification of the apparatus required to manufacture the package, and, consequently, the reduction of financial investment required to produce the packages.

An additional simplification of the process is achieved by using the modified apparatus and process shown in FIG. 5 (referred to as the "NFA Dipping" approach). Using this approach, there is no need to pre-apply the NFA to the substrate, and the NFA pattern is self-aligned to the die and bonding site.

In a typical embodiment, the material of the bump is solder, the material of the pad is Ni and Au-plated Cu, and the bumps have an elongated hemispherical shape. These features have been merely taken from the conventional art for the sake of illustration; however, variations in these features are possible within the scope of the basic approach. Notably, and as an example, the hemispherical shape of the bump results from the wafer-level reflow of the bumps; prior to wafer-level reflow, the bumps are typically rectangular or trapezoidal. With the method according to the invention, a wafer level reflow operation may be unnecessary.

Other embodiments are within the following claims.

What is claimed is:

1. A method for forming flip chip interconnection between a semiconductor die and a substrate, comprising:
   mounting the substrate to a carrier, the substrate having a plurality of interconnect sites on conductive traces formed on a die attach surface of the substrate;
   forming a plurality of bumps on an active surface of the semiconductor die, the bumps containing fusible material;
   mounting a backside of the semiconductor die, opposite the active surface, to a thermode placement tool which generates thermal energy under control of a temperature controller;
   depositing a resin material between the semiconductor die and substrate sufficient to cover the interconnect sites;
   aligning the bumps of the semiconductor die to the interconnect sites of the substrate;
   bringing the bumps into contact with the resin material;
   applying a force with the thermode placement tool to bring the bumps into contact with the interconnect sites, the force being sufficient to displace the resin material and deform the bumps against the interconnect sites;
   after deforming the bumps against the interconnect sites using the force of the thermode placement tool, employing the thermode placement tool to heat the semiconductor die and bring the resin material to a gel stage;
   selecting a first temperature of the thermode placement tool to partially cure without completely curing the resin material and stabilize the semiconductor die to the substrate;
   after partially curing the resin material, removing the force applied to the semiconductor die;
   after removing the force applied to the semiconductor die, heating an entirety of the fusible material of the bumps to a molten state using the thermal energy from the thermode placement tool, wherein the partially cured resin material prevents flow of the fusible material to adjacent interconnect sites and conductive traces;
   re-solidifying the fusible material to form metallurgical bond between the bumps and interconnect sites; and
   after re-solidifying the fusible material, substantially curing the resin material.

2. The method of claim 1 wherein the gel stage is resilient enough to allow some compression, and is sufficiently firm to contain the molten fusible material.

3. The method of claim 1, wherein the first temperature is applied a predetermined time after the force is applied.

4. The method of claim 1, further including selecting a second temperature after the force is removed to heat the entirety of the fusible material to the molten state.

5. The method of claim 4, wherein the second temperature is at least 170 degrees Centigrade.

6. A method for forming flip chip interconnection between a semiconductor die and a substrate, comprising:
   mounting the substrate to a carrier, the substrate having a plurality of interconnect sites on conductive traces formed on a die attach surface of the substrate;
   forming a plurality of bumps on an active surface of the semiconductor die, the bumps containing fusible material;
   mounting a backside of the semiconductor die, opposite the active surface, to a thermode placement tool which generates thermal energy under control of a temperature controller;
   depositing a resin material between the semiconductor die and substrate sufficient to cover interconnect sites;
   aligning the bumps of the semiconductor die to the interconnect sites of the substrate;
   applying a force with the thermode placement tool to bring the bumps into contact with the interconnect sites, the force being sufficient to displace the resin material and deform the bumps against the interconnect sites;
   after deforming the bumps against the interconnect sites using the force of the thermode placement tool, employing the thermode placement tool to heat the semiconductor die and bring the resin material to a gel stage;

partially curing the resin material to stabilize the semiconductor die to the substrate;

after partially curing the resin material, removing the force applied to the semiconductor die;

after removing the force applied to the semiconductor die, disengaging the semiconductor die from the thermode placement tool;

placing the semiconductor die and substrate in a reflow oven;

heating an entirety of the fusible material of the bumps to a molten state using the thermal energy from the reflow oven, the partially cured resin material preventing flow of the fusible material to adjacent interconnect sites and conductive traces;

re-solidifying the fusible material to form metallurgical bond between the bumps and interconnect sites; and after re-solidifying the fusible material, substantially curing the resin material.

7. The method of claim 6, further including re-melting the fusible material.

8. The method of claim 7, wherein the fusible material is re-melted in a reflow oven.

9. The method of claim 6, wherein a pitch between the bumps is 60 micrometers.

10. A method for forming flip chip interconnection between a semiconductor die and a substrate, comprising:
   mounting the semiconductor die and the substrate to a thermode placement tool;
   depositing a resin material between the semiconductor die and the substrate sufficient to cover interconnect sites formed on the substrate;
   aligning bumps formed on the semiconductor die to the interconnect sites of the substrate;
   applying a force with the thermode placement tool to bring the bumps into contact with the interconnect sites;
   heating the semiconductor die to bring the resin material to a gel stage;
   partially curing the resin material to stabilize the semiconductor die to the substrate;
   after partially curing the resin material, removing the force applied to the semiconductor die;
   after removing the force applied to the semiconductor die, disengaging the semiconductor die from the thermode placement tool;
   placing the semiconductor die and substrate in a reflow oven;
   heating the bumps to a molten state using the thermal energy from the reflow oven, the partially cured resin material preventing flow of the bumps to adjacent interconnect sites and conductive traces;
   re-solidifying the bumps to form metallurgical bond between the bumps and interconnect sites; and
   after re-solidifying the bumps, substantially curing the resin material.

11. The method of claim 10, wherein a first temperature is applied a predetermined time after the force is applied.

12. The method of claim 10, wherein the bumps contain fusible material.

13. The method of claim 12, further including selecting a second temperature after the force is removed to heat the entirety of the fusible material to the molten state.

14. The method of claim 13, wherein the second temperature is at least 170 degrees Centigrade.

15. The method of claim 12, further including re-melting the fusible material.

16. The method of claim 15, wherein the fusible material is re-melted in a reflow oven.

17. The method of claim 10, wherein a pitch between the bumps is 60 micrometers.

18. A method for forming flip chip interconnection between a semiconductor die and a substrate, comprising:
   mounting the semiconductor die and the substrate to a thermode placement tool;
   depositing a resin material between the semiconductor die and the substrate sufficient to cover interconnect sites formed on the substrate;
   aligning bumps formed on the semiconductor die to the interconnect sites of the substrate;
   applying a force with the thermode placement tool to bring the bumps into contact with the interconnect sites;
   heating the resin material to a gel stage;
   partially curing the resin material to stabilize the semiconductor die to the substrate;
   disengaging the semiconductor die from the thermode placement tool;
   placing the semiconductor die and the substrate in a reflow oven;
   heating the bumps to a molten state using the thermal energy from the reflow oven, the partially cured resin material preventing flow of the bumps to adjacent interconnect sites and conductive traces;
   re-solidifying the bumps to form metallurgical bond between the bumps and interconnect sites; and
   substantially curing the resin material.

19. The method of claim 18, wherein a first temperature is applied a predetermined time after the force is applied.

20. The method of claim 18, wherein the bumps contain fusible material.

21. The method of claim 20, further including selecting a second temperature after the force is removed to heat the entirety of the fusible material to the molten state.

22. The method of claim 21, wherein the second temperature is at least 170 degrees Centigrade.

23. The method of claim 20, further including re-melting the fusible material.

24. The method of claim 23, wherein the fusible material is re-melted in a reflow oven.

25. The method of claim 18, wherein a pitch between the bumps is 60 micrometers.

26. A method for forming flip chip interconnection between a semiconductor die and a substrate, comprising:
   mounting the semiconductor die and the substrate to a thermode placement tool;
   depositing a resin material between the semiconductor die and the substrate sufficient to cover interconnect sites formed on the substrate;
   aligning bumps formed on the semiconductor die to the interconnect sites of the substrate;
   applying a force with the thermode placement tool to bring the bumps into contact with the interconnect sites;
   heating the resin material to a gel stage;
   partially curing the resin material to stabilize the semiconductor die to the substrate;
   removing the force applied to the semiconductor die;
   heating the bumps to a molten state, the partially cured resin material preventing flow of the bumps to adjacent interconnect sites and conductive traces;
   re-solidifying the bumps to form metallurgical bond between the bumps and interconnect sites; and
   after re-solidifying the bumps, substantially curing the resin material.

27. The method of claim 26, wherein a first temperature is applied a predetermined time after the force is applied.

28. The method of claim 26, wherein the bumps contain fusible material.

29. The method of claim 28, further including selecting a second temperature after the force is removed to heat the entirety of the fusible material to the molten state.

30. The method of claim 29, wherein the second temperature is at least 170 degrees Centigrade.

31. The method of claim 28, further including re-melting the fusible material.

32. The method of claim 31, wherein the fusible material is re-melted in a reflow oven.

33. The method of claim 26, wherein a pitch between the bumps is 60 micrometers.

* * * * *